United States Patent
Wu et al.

(10) Patent No.: US 11,728,807 B2
(45) Date of Patent: Aug. 15, 2023

(54) POWER SWITCH CIRCUIT WITH CURRENT SENSING

(71) Applicant: uPI semiconductor corp., Zhubei (TW)

(72) Inventors: Chia-Lung Wu, Zhubei (TW); Shao-Lin Feng, Zhubei (TW)

(73) Assignee: UPI SEMICONDUCTOR CORP., Zhubei (TW)

(*) Notice: Subject to any disclaimer, the term of this patent is extended or adjusted under 35 U.S.C. 154(b) by 0 days.

(21) Appl. No.: 17/519,608

(22) Filed: Nov. 5, 2021

(65) Prior Publication Data

US 2022/0166424 A1    May 26, 2022

(30) Foreign Application Priority Data

Nov. 20, 2020   (CN) .......................... 202011309930.7

(51) Int. Cl.
*H03K 17/56* (2006.01)
*G01R 19/00* (2006.01)

(52) U.S. Cl.
CPC ......... *H03K 17/56* (2013.01); *G01R 19/0092* (2013.01)

(58) Field of Classification Search
None
See application file for complete search history.

(56) References Cited

U.S. PATENT DOCUMENTS

| | | | |
|---|---|---|---|
| 7,960,997 B2 * | 6/2011 | Williams | ............ H01L 29/7833 324/762.09 |
| 8,358,157 B2 | 1/2013 | Gillberg | |
| 8,922,176 B2 | 12/2014 | Tetelbaum et al. | |
| 8,937,467 B2 * | 1/2015 | Qin | ........................ H02M 3/158 323/282 |
| 9,046,905 B2 * | 6/2015 | Qin | ..................... H02M 3/1588 |
| 9,467,136 B1 | 10/2016 | Nguyen | |
| 9,671,438 B2 | 6/2017 | Zhang et al. | |
| 9,791,480 B2 * | 10/2017 | Qin | .................... G01R 19/0092 |
| 10,177,576 B2 | 1/2019 | Huang et al. | |
| 10,418,986 B2 | 9/2019 | Nguyen et al. | |
| 10,804,691 B2 * | 10/2020 | Easwaran | ............ H03K 17/687 |
| 2008/0204958 A1 * | 8/2008 | Shearon | ................... H02H 3/18 361/93.9 |
| 2019/0245382 A1 * | 8/2019 | Liu | ..................... G01R 19/0092 |
| 2020/0313418 A1 * | 10/2020 | Wu | ........................ H02H 9/025 |
| 2021/0083567 A1 * | 3/2021 | Hasan | ................... H02M 1/088 |
| 2021/0126632 A1 * | 4/2021 | Illing | ................... H03K 17/122 |

* cited by examiner

*Primary Examiner* — Thomas J. Hiltunen
*Assistant Examiner* — Khareem E Almo
(74) *Attorney, Agent, or Firm* — McClure, Qualey & Rodack, LLP

(57) ABSTRACT

A power switch circuit with current sensing is disclosed. The power switch circuit is coupled between an input voltage and an output terminal. The power switch circuit includes a power switch, a first sensing switch, an adjusting circuit and a second sensing switch. The power switch is coupled to the input voltage. The first sensing switch is coupled in series between the power switch and the output terminal. There is a first node between the first sensing switch and the power switch. The adjusting circuit is coupled to the first node. The second sensing switch is coupled between the adjusting circuit and the output terminal. A control terminal of the power switch is coupled to a first control voltage. Control terminals of the first sensing switch and the second sensing switch are coupled to a second control voltage. The second control voltage is different from the first control voltage.

6 Claims, 3 Drawing Sheets

POWER SWITCH CIRCUIT WITH CURRENT SENSING

BACKGROUND OF THE INVENTION

1. Field of the Invention

The invention relates to a power switch; in particular, to a power switch circuit with current sensing.

2. Description of the Prior Art

As shown in FIG. 1, the conventional current sensing circuit 1 usually uses a sensing switch 125 sharing gate and source with a power switch 115 to sense an output current ILOAD to obtain a sensing current IOUT, and it uses a feedback circuit including an error amplifier 140 and a feedback switch 130 to calibrate current sensing error. A current limiting circuit 160 controls a gate voltage VG of the power switch 115 according to the current sensing result to achieve the effect of limiting the output current ILOAD.

The calibration principle of the above-mentioned current sensing circuit 1 is: when the voltages of gate, source and drain of the power switch 115 are equal to those of the sensing switch 125, a ratio of currents flowing through the power switch 115 and the sensing switch 125 is equal to a ratio of their areas. Since the power switch 115 and the sensing switch 125 share gate and source, an error amplifying signal can be generated according to a voltage difference between two input terminals of the error amplifier 140 as a control voltage VG of the feedback switch 130 to change its on-resistance.

Since the on-resistance of the feedback switch 130 and the on-resistance of the sensing switch 125 form a resistance voltage-dividing circuit to adjust a node voltage between the sensing switch 125 and the feedback switch 130, the voltages at the two input terminals of the error amplifier 140 can be kept equal to ensure that the drain voltages of the power switch 115 and the sensing switch 125 are equal. Therefore, a stable proportion between the output current ILOAD and the sensing current IOUT can be maintained.

However, the above-mentioned current sensing circuit 1 still has the following problems in actual operations: when the output voltage at the load 120 is zero, there is at least a bias voltage (for example, the on-voltage of the transistor is 0.7 volts, but not limited to this) caused by the feedback switch 130 between the two input terminals of the error amplifier 140 which is not zero, resulting in poor calibration effect. This problem needs to be improved.

SUMMARY OF THE INVENTION

Therefore, the invention provides a power switch circuit with current sensing to solve the above-mentioned problems of the prior arts.

A preferred embodiment of the invention is a power switch circuit with current sensing. In this embodiment, the power switch circuit is coupled between an input voltage and an output terminal. The power switch circuit includes a power switch, a first sensing switch, an adjusting circuit and a second sensing switch. The power switch is coupled to the input voltage. The first sensing switch is coupled in series between the power switch and the output terminal. There is a first node between the first sensing switch and the power switch. The adjusting circuit is coupled to the first node. The second sensing switch is coupled between the adjusting circuit and the output terminal. A control terminal of the power switch is coupled to a first control voltage. Control terminals of the first sensing switch and the second sensing switch are coupled to a second control voltage. The second control voltage is different from the first control voltage.

In an embodiment, the power switch circuit further includes a voltage supply circuit. The voltage supply circuit is coupled to the control terminal of the power switch and the control terminal of the first sensing switch respectively and configured to generate the first control voltage and the second control voltage according to the input voltage.

In an embodiment, the power switch circuit further includes a current source. The current source is coupled between the voltage supply circuit and the control terminal of the power switch and configured to receive the first control voltage and provide a current to the power switch.

In an embodiment, the second control voltage has a fixed voltage value, so that the first sensing switch and the second sensing switch continue to be operated in a linear region.

In an embodiment, there is a second node between the adjusting circuit and the second sensing switch, and the adjusting circuit includes an error amplifier and a third sensing switch. The error amplifier has two input terminals coupled to the first node and the second node respectively. The third sensing switch has a control terminal coupled to an output terminal of the error amplifier and one terminal of the third sensing switch is coupled to the second node.

In an embodiment, the second sensing switch and the first sensing switch match, and the second sensing switch generates a sensing signal according to an output current of the output terminal.

In an embodiment, the power switch circuit further includes a current limiting circuit. The current limiting circuit is coupled to the control terminal of the power switch and a reference voltage and configured to provide a current limiting signal to the control terminal of the power switch according to a sensing voltage related to the sensing signal and the reference voltage to limit the output current.

In an embodiment, the power switch circuit further includes a current duplication circuit. The current duplication circuit is coupled to the second sensing switch and configured to provide a sensing current according to a sensing signal generated by the second sensing switch.

In an embodiment, the power switch circuit further includes a sensing resistor. The sensing resistor is coupled between the current duplication circuit and a ground terminal and configured to convert the sensing current into a sensing voltage and provide the sensing voltage to a current limiting circuit.

Compared to the prior art, the power switch circuit with current sensing of the invention can overcome the aforementioned problems through the first sensing switch and limit the operating range of the sensing switch to the linear region by separately supplying the control voltages of the power switch and the sensing switch, so its current sensing function will not be affected by the current limiting mechanism; therefore, its current sensing accuracy can be effectively improved.

The advantage and spirit of the invention may be understood by the following detailed descriptions together with the appended drawings.

BRIEF DESCRIPTION OF THE APPENDED DRAWINGS

DETAILED DESCRIPTION OF THE INVENTION

Figure 1:
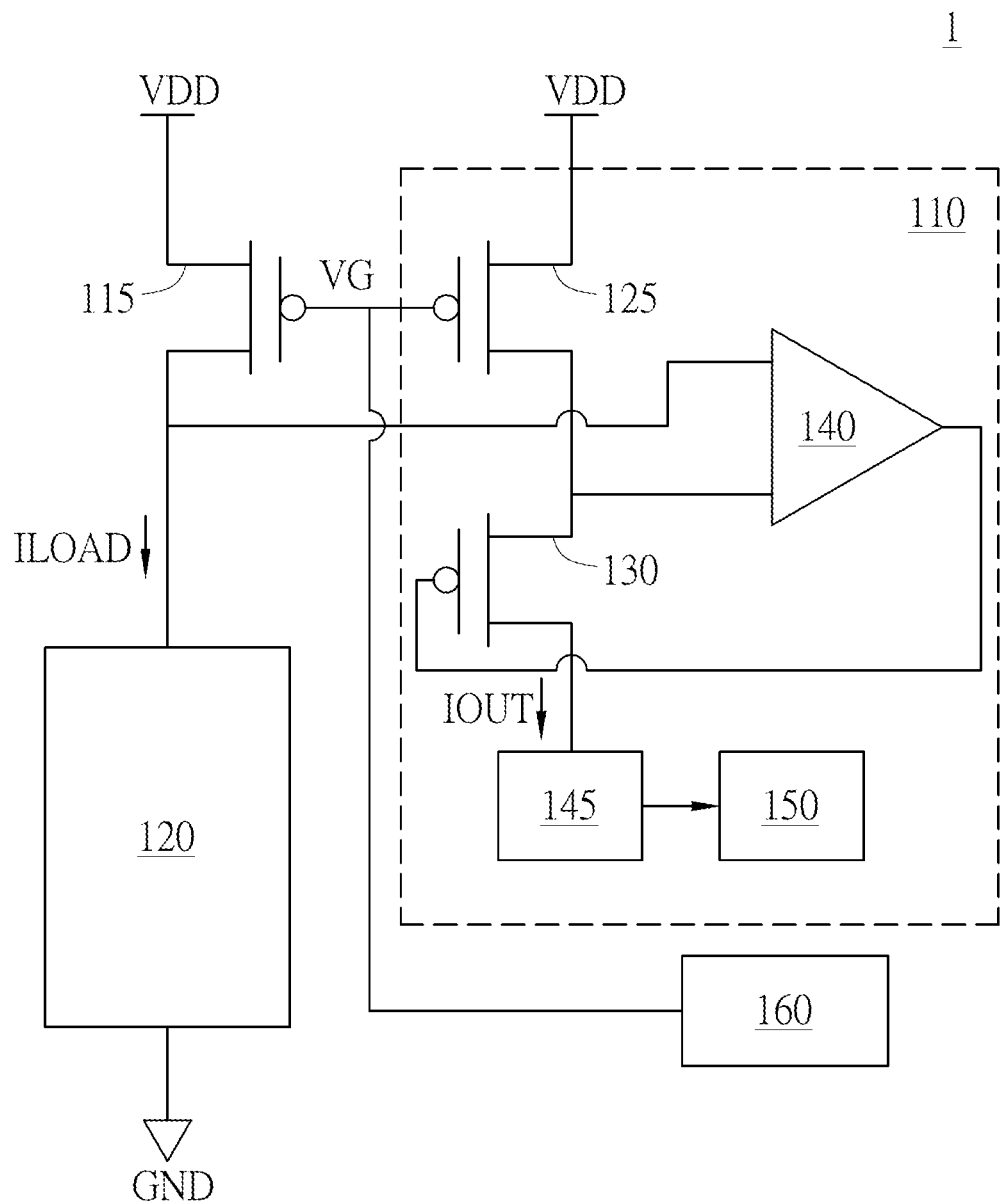
FIG. 1 illustrates a schematic diagram of a conventional MOS-type current sensing circuit.

Reference will now be made in detail to the exemplary embodiments, the same or similar reference numbers or components used in the drawings and the embodiments are used to represent the same or similar parts.

Figure 2:
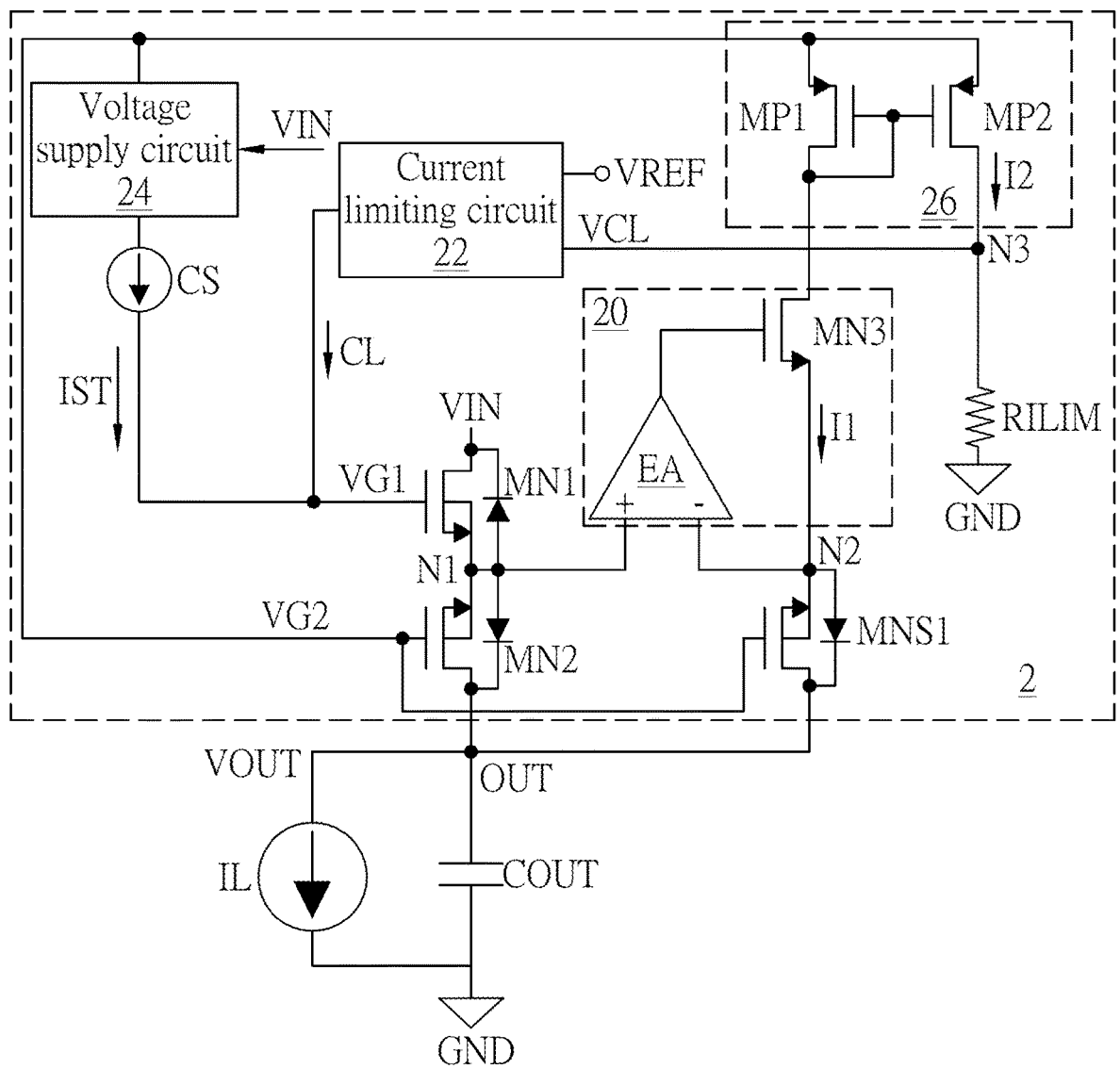
FIG. 2 illustrates a schematic diagram of a power switch circuit with current sensing according to an embodiment of the invention.

An embodiment of the invention is a power switch circuit with current sensing. Please refer to FIG. 2. FIG. 2 is a schematic diagram of the power switch circuit with current sensing in this embodiment.

As shown in FIG. 2, the power switch circuit 2 is coupled between an input voltage VIN and an output terminal OUT. The output terminal OUT is coupled to one terminal of an output capacitor CL and the other terminal of the output capacitor CL is coupled to a ground terminal GND. The output terminal OUT has an output voltage VOUT and an output current IL flows from the output terminal OUT to the ground terminal GND.

The power switch circuit 2 includes a power switch MN1, a first sensing switch MN2, a second sensing switch MNS1, an adjusting circuit 20, a current limiting circuit 22, a voltage supply circuit 24, a current duplication circuit 26, a current source CS and a sensing resistor RILIM.

The power switch MN1 and the first sensing switch MN2 are coupled in series between the input voltage VIN and the output terminal OUT, and there is a first node N1 between the power switch MN1 and the first sensing switch MN2. The second sensing switch MNS1 is coupled between the adjusting circuit 20 and the output terminal OUT. The second sensing switch MNS1 and the first sensing switch MN2 match, and a control terminal of the second sensing switch MNS1 and a control terminal of the first sensing switch MN2 are coupled to each other.

The adjusting circuit 20 is coupled between the second sensing switch MNS1 and the current duplication circuit 26, and the adjusting circuit 20 is also coupled to the first node N1. There is a second node N2 between the adjusting circuit 20 and the second sensing switch MNS1.

In this embodiment, the adjusting circuit 20 includes an error amplifier EA and a third sensing switch MN3. The third sensing switch MN3 is coupled between the second sensing switch MNS1 and the current duplication circuit 26, and the second node N2 is located between the third sensing switch MN3 and the second sensing switch MNS1. An input terminal + of the error amplifier EA is coupled to the first node N1 between the power switch MN1 and the first sensing switch MN2. An input terminal − of the error amplifier EA is coupled to the second node N2 between the third sensing switch MN3 and the second sensing switch MNS1. An output terminal of the error amplifier EA is coupled to a control terminal of the third sensing switch MN3.

The sensing resistor RILIM is coupled between the current duplication circuit 26 and the ground terminal GND, and there is a third node N3 between the current duplication circuit 26 and the sensing resistor RILIM. The current limiting circuit 22 is coupled to a reference voltage VREF, the third node N3 between the current duplication circuit 26 and the sensing resistor RILIM, and the control terminal of the power switch MN1 respectively.

The voltage supply circuit 24 is coupled to the input voltage VIN, the current duplication circuit 26 and the control terminals of the power switch MN1, the first sensing switch MN2 and the second sensing switch MNS1 respectively. The current source CS is coupled between the voltage supply circuit 24 and the control terminal of the power switch MN1.

The voltage supply circuit 24 receives the input voltage VIN and generates different first control voltage VG1 and second control voltage VG2 to the control terminals of the power switch MN1 and the first sensing switch MN2 respectively according to the input voltage VIN. In other words, the control terminals of the power switch MN1 and the first sensing switch MN2 are coupled to and controlled by the different first control voltages VG1 and second control voltages VG2 respectively. The current source CS generates a current IST to the power switch MN1 according to the first control voltage VG1 to perform a soft start of the power switch MN1.

In practical applications, the current source CS is settable, and it can couple to an external resistor (not shown) through a setting pin to change the current value of the current IST (such as the current of uA level) provided by it based on actual requirements to change the speed of soft start, but not limited to this.

The second sensing switch MNS1 generates a sensing signal I1 related to the output current IL to the adjusting circuit 20 according to the output current IL of the output terminal OUT. In an embodiment, assuming that the first sensing switch MN2 and the second sensing switch MNS1 are the same and an area ratio of the first sensing switch MN2 to the second sensing switch MNS1 is MOC:1, the sensing signal I1 will be equal to (IL/MOC), but not limited to this.

In an embodiment, the current duplication circuit 26 is a current mirror with a magnification constant K and includes switches MP1 and MP2 whose control terminals are coupled to each other. The switch MP1 is coupled to the voltage supply circuit 24 and the adjusting circuit 20 respectively. The switch MP2 is coupled to the voltage supply circuit 24 and the third node N3 respectively. When the current duplication circuit 26 receives the sensing signal I1 from the adjusting circuit 20, the current duplication circuit 26 will generate a sensing current I2 to the sensing resistor RILIM according to the sensing signal I1 and the magnification constant K, and the sensing resistor RILIM will convert the sensed current I2 into a sensing voltage VCL at the third node N3 to be provided to the current limiting circuit 22.

To continue the above, when the sensing signal I1 is equal to (IL/MOC), the sensing current I2 provided by the current duplication circuit 26 according to the sensing signal I1 will be equal to [IL/(MOC*K)] and the sensing voltage VCL will be equal to [(IL*RILIM)/(MOC*K)], so the magnification of the sensing current I2 can be adjusted according to design requirements, but not limited to this. In fact, the sensing resistor RILIM is an external resistor and the user can select an appropriate resistor to generate the sensing voltage VCL according to requirements, but not limited to this.

In other words, the sensing voltage VCL received by the current limiting circuit 22 is related to the sensing signal I1, that is to say, the sensing voltage VCL is related to the output current IL. When the current limiting circuit 22 receives the reference voltage VREF and the sensing voltage VCL related to the output current IL, the current limiting circuit 22 will provide a current limiting signal CL to the control terminal of the power switch MN1 according to the reference voltage VREF and the sensing voltage VCL to adjust the first control voltage VG1, so that the first on-resistance RON1 of the power switch MN1 is changed to achieve the effect of limiting the output current IL.

It should be noted that since the second sensing switch MNS1 and the first sensing switch MN2 match, and the control terminals of both are controlled by the second control voltage VG2, one terminal (for example, the drain) of both is coupled to the output terminal OUT, and the control terminal of the power switch MN1 is controlled by the first control voltage VG1 different from the second control voltage VG2. Therefore, when the power switch MN1 receives the current limiting signal CL of the current limiting circuit 22 and is operated in the saturation region, the second control voltage VG2 with a fixed voltage value will make the first sensing switch MN2 and the second sensing switch MNS1 with current sensing function to be continuously operated in the linear region without being affected by the current limiting signal CL.

Figure 3:
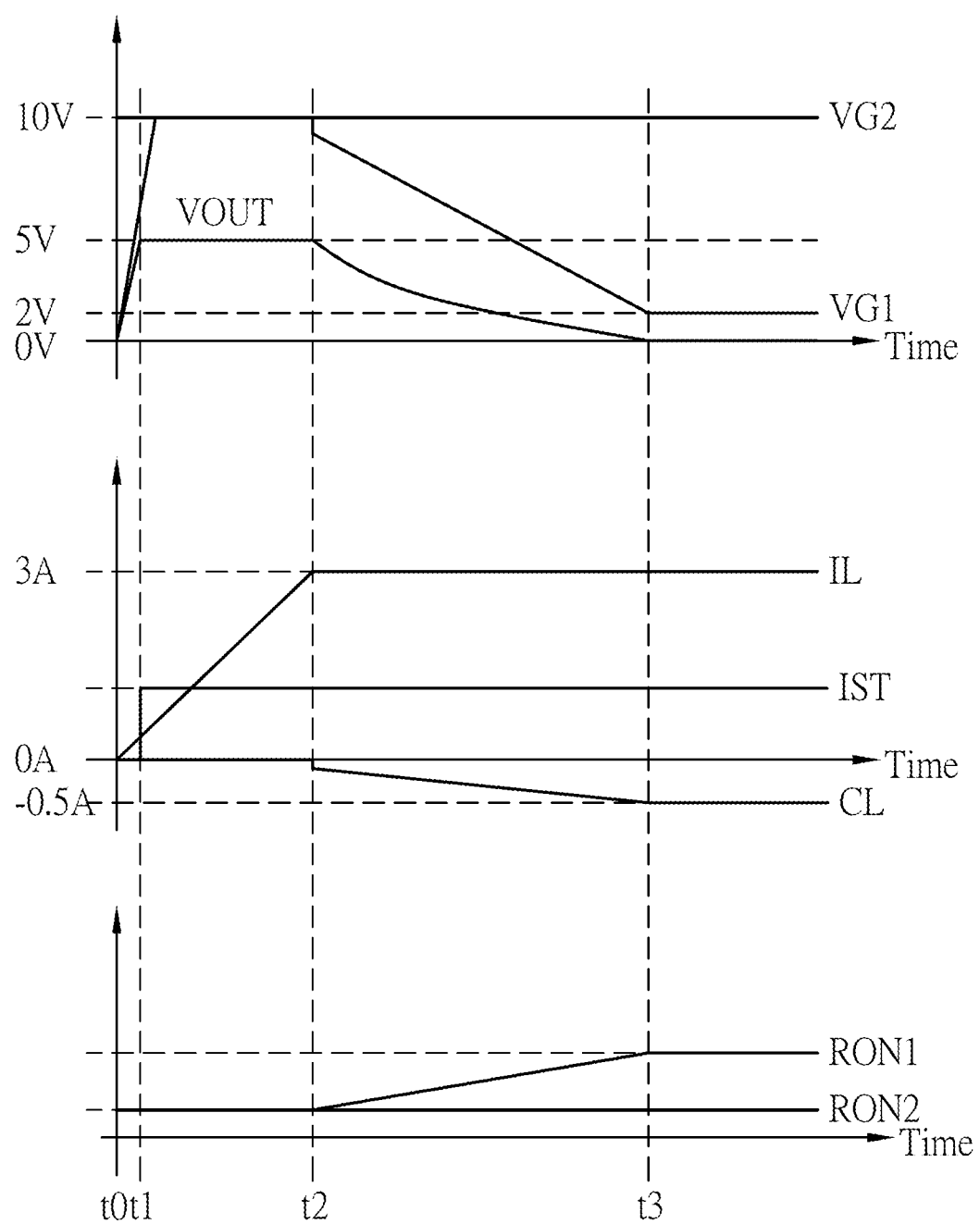
FIG. 3 illustrates a timing diagram of the waveforms of the signals in FIG. 2.

Please refer to FIG. 2 and FIG. 3. In an embodiment, at the time t0, the circuit is activated, the current source CS receives the voltage provided by the voltage supply circuit 24 and generates a current IST of several uA to the control terminal of the power switch MN1 to soft start the power switch MN1; at the time t1, the power switch MN1 is turned on. During a period from the time t1 to the time t2, the current source CS provides the current IST with a fixed value to make the system work normally, and the output voltage VOUT is maintained at 5 volts, the first control voltage VG1 and the second control voltage VG2 are both maintained at 10 volts, and the load is pumped to make the output current IL to continue increasing, the first on-resistance RON1 of the power switch MN1 and the second on-resistance RON2 of the first sensing switch MN2 are both maintained in the linear region;

At the time t2, the output current IL is increased to a protection value (for example, 3 amperes) and the current limiting circuit 22 is triggered to output the current limiting signal CL, so that the power switch MN1 enters a saturation region. In this example, the current limiting signal CL is a negative current to reduce the current IST, so that the first control voltage VG1 received by the control terminal of the power switch MN1 is decreased. Therefore, during a period from the time t2 to the time t3, the on-resistance RON1 of the power switch MN1 will continue increasing, and the output current IL will maintain the protection value, so that the output voltage VOUT will continue decreasing;

At the time t3, the output voltage VOUT is decreased to 0 volts. After the time t3, since the second control voltage VG2 is still maintained at a constant value (for example, 10 volts), the first sensing switch MN2 continues to be operated in the linear region, and its second on-resistance RON2 is also maintained at a constant value, so that there will be no sensing error during the current limiting period, and the output current IL can still be maintained at the protection value (for example, 3 amperes) without decreasing.

In other words, during the current limiting period, the power switch MN1 will be affected by the current limiting mechanism to achieve the function of limiting the output current IL, but the first sensing switch MN2 does not. On the contrary, the first sensing switch MN2 with current sensing function continues to be operated in the linear region during the current limiting period, and its sensing result will not be affected by the current limiting mechanism.

Compared to the prior art, the power switch circuit with current sensing of the invention can overcome the aforementioned problems through the first sensing switch and limit the operating range of the sensing switch to the linear region by separately supplying the control voltages of the power switch and the sensing switch, so its current sensing function will not be affected by the current limiting mechanism; therefore, its current sensing accuracy can be effectively improved.

With the example and explanations above, the features and spirits of the invention will be hopefully well described. Those skilled in the art will readily observe that numerous modifications and alterations of the device may be made while retaining the teaching of the invention. Accordingly, the above disclosure should be construed as limited only by the metes and bounds of the appended claims.

What is claimed is:

1. A power switch circuit with current sensing, coupled between an input voltage and an output terminal, the power switch circuit comprising:
   a power switch, coupled to the input voltage;
   a first sensing switch, coupled in series between the power switch and the output terminal, there being a first node between the first sensing switch and the power switch;
   a voltage supply circuit, coupled to a control terminal of the power switch and a control terminal of the first sensing switch respectively, configured to generate a first control voltage and a second control voltage different from the first control voltage according to the input voltage;
   a current source, coupled between the voltage supply circuit and the control terminal of the power switch, configured to generate a current to the control terminal of the power switch;
   an adjusting circuit, coupled to the first node; and
   a second sensing switch, coupled between the adjusting circuit and the output terminal,
   wherein the control terminal of the power switch is coupled to the first control voltage, the control terminals of the first sensing switch and the second sensing switch are coupled to the second control voltage,
   wherein the output voltage of the output terminal is decreased to 0, the second control voltage is fixed and an on-resistance of the first sensing switch operated in a linear region is maintained at a constant value, so an output current of the output terminal is maintained at a protection value without decreasing.

2. The power switch circuit of claim 1, wherein there is a second node between the adjusting circuit and the second sensing switch, and the adjusting circuit comprises:
   an error amplifier, having two input terminals coupled to the first node and the second node respectively; and
   a third sensing switch, having a control terminal coupled to an output terminal of the error amplifier and one terminal of the third sensing switch being coupled to the second node.

3. The power switch circuit of claim 1, wherein the second sensing switch and the first sensing switch match, and the second sensing switch generates a sensing signal according to an output current of the output terminal.

4. The power switch circuit of claim 3, further comprising:
   a current limiting circuit, coupled to the control terminal of the power switch and a reference voltage, configured to provide a current limiting signal to the control terminal of the power switch according to a sensing voltage related to the sensing signal and the reference voltage to limit the output current.

5. The power switch circuit of claim 1, further comprising:

a current duplication circuit, coupled to the second sensing switch, configured to provide a sensing current according to a sensing signal generated by the second sensing switch.

6. The power switch circuit of claim 5, further comprising:
a sensing resistor, coupled between the current duplication circuit and a ground terminal, configured to convert the sensing current into a sensing voltage and provide the sensing voltage to a current limiting circuit.

* * * * *